(12) United States Patent
Lu et al.

(10) Patent No.: US 10,367,117 B2
(45) Date of Patent: Jul. 30, 2019

(54) APPARATUS AND METHOD FOR TRANSFERRING MICRO LIGHT-EMITTING DIODES

(71) Applicant: Shenzhen China Star Optoelectronics Technology Co., Ltd., Shenzhen (CN)

(72) Inventors: Macai Lu, Shenzhen (CN); Jiangbo Yao, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 144 days.

(21) Appl. No.: 15/551,282

(22) PCT Filed: Jun. 20, 2017

(86) PCT No.: PCT/CN2017/089260
§ 371 (c)(1),
(2) Date: Aug. 15, 2017

(87) PCT Pub. No.: WO2018/214201
PCT Pub. Date: Nov. 29, 2018

(65) Prior Publication Data
US 2018/0342643 A1    Nov. 29, 2018

(30) Foreign Application Priority Data
May 23, 2017   (CN) .......................... 2017 1 0369880

(51) Int. Cl.
*H01L 21/00* (2006.01)
*H01L 33/00* (2010.01)
(Continued)

(52) U.S. Cl.
CPC ........ *H01L 33/005* (2013.01); *H01L 21/6835* (2013.01); *H01L 33/00* (2013.01);
(Continued)

(58) Field of Classification Search
CPC .. B05D 1/02; B05D 3/02; B05D 3/024; H01L 21/67051
See application file for complete search history.

(56) References Cited

U.S. PATENT DOCUMENTS

2014/0033528 A1   2/2014  Lin
2015/0303151 A1*  10/2015 Kobayashi .............. H01L 24/19
                                                    174/261
2017/0162405 A1*  6/2017  Gleissner .......... H01L 21/67051

FOREIGN PATENT DOCUMENTS

CN        106299079 A       1/2017
JP        2001318604 A      11/2001
WO       WO2016207640 A1    12/2016

* cited by examiner

*Primary Examiner* — Richard A Booth
(74) *Attorney, Agent, or Firm* — Leong C. Lei

(57) ABSTRACT

The present invention provides an apparatus and a method for transferring micro light-emitting diodes. Said apparatus for transferring the micro light-emitting diodes comprises a main body, and a spraying module, a cooling module and a heating module disposed on said main body. The spraying module sprays metallic adhesive liquid onto the micro light-emitting diodes that wait to transfer, the cooling module cools the metallic adhesive liquid on the wait-to-transfer micro light-emitting diodes, thereby curing the metallic adhesive liquid to adhesively bond the main body with the wait-to-transfer micro light-emitting diodes together implementing the transfer of the micro light-emitting diodes, After transferred to reach the position, the cured metallic adhesive liquid is heated by the heating module, thereby melting the metallic adhesive liquid to separate the main body from the wait-to-transfer micro light-emitting diodes. This is capable of lowering the difficulty of transferring the micro light-emitting diodes, and enhancing the efficiently of transferring the micro light-emitting diodes.

10 Claims, 9 Drawing Sheets

(51) Int. Cl.
*H01L 21/683* (2006.01)
*H01L 33/20* (2010.01)
(52) U.S. Cl.
CPC .......... *H01L 33/0095* (2013.01); *H01L 33/20* (2013.01); *H01L 2221/68381* (2013.01)

APPARATUS AND METHOD FOR TRANSFERRING MICRO LIGHT-EMITTING DIODES

FIELD OF INVENTION

The present invention relates to a display technical field, and more particularly to an apparatus and a method for transferring micro light-emitting diodes.

DESCRIPTION OF PRIOR ART

Because having the advantages of high quality, power saving, thin body and wide applications, flat panel display devices have been widely applied in various consumptive electronic devices, such as mobile phones, personal digital assistants, digital cameras, laptops, and desktop computers, and become a mainstream in the display devices.

A micro LED display that is a display accomplishing image display by integrating high density and small size LED arrays acting as display pixels on a substrate, as same as the large-size outdoor LED display where each pixel can be addressed and individually driven to illuminate, can be regarded as a scaled-down version of the outdoor LED display, to reduce the pixel distance from millimeter to micron. The Micro LED display and the organic light-emitting-diode (OLED) display are belong to self-luminous displays; however, compared with OLED display, the Micro LED display has better material stability, longer life, no image mark, etc., which is considered as the biggest competitor of the OLED display.

In the manufacturing process of the micro LED display panel, the micro light-emitting diodes must grow on an original substrate (such as sapphire-type substrate) by the molecular beam epitaxial method, for making the display panel, the micro light-emitting-diode devices should be transferred from the original substrate to a receiving substrate applied for forming the display panel, with arrangement in display arrays thereon. Concretely, the micro light-emitting diodes are firstly formed on the original substrate, and then, the micro light-emitting diodes are lifted off from the original substrate by a laser lift-off (LLO) technology, and by transfer heads made of a material such as polydimethylsiloxane (PDMS), the micro light-emitting diodes are absorbed from the original substrate to preset positions of the receiving substrate.

In the prior technology, the transfer heads for transferring the micro light-emitting diodes often absorb the micro light-emitting diodes to accomplish the transfer of the micro light-emitting diodes by way of electrostatic force, the method has a strict requirement for gap between the transfer heads and transferred objects, if a deviation of transfer gap occurs, it would result in transfer failure thereby causing the display panel defective.

SUMMARY OF THE INVENTION

An object of the present invention is to provide an apparatus for transferring micro light-emitting diodes, which is capable of lowering the difficulty of the transferring the micro light-emitting diodes, and enhancing the efficiently of transferring the micro light-emitting diodes.

An object of the present invention is to further provide a method for transferring micro light-emitting diodes, which is capable of lowering the difficulty of the transferring the micro light-emitting diodes, and enhancing the efficiently of transferring the micro light-emitting diodes.

To accomplish the aforementioned object, the present invention provides an apparatus for transferring micro light-emitting diodes, which comprises: a main body, and a spraying module, a cooling module and a heating module that are disposed on said main body;

said spraying module is applied for spraying metallic adhesive liquid onto the micro light-emitting diodes that wait to transfer;

said cooling module is applied for cooling the metallic adhesive liquid on the wait-to-transfer micro light-emitting diodes, thereby curing the metallic adhesive liquid, to adhesively bond the main body with the wait-to-transfer micro light-emitting diodes together; and said heating module is applied for heating the cured metallic adhesive liquid, thereby melting the metallic adhesive liquid, to separate the main body from the wait-to-transfer micro light-emitting diodes.

Said main body comprises: a number of sequentially arranged transfer heads each disposed with a spraying nozzle on a bottom portion thereof, said spraying module sprays the metallic adhesive liquid onto the wait-to-transfer micro light-emitting diodes via the spraying nozzle.

Each neighboring pair of the transfer heads are disposed with a gas-blowing hole on therebetween, said cooling module blows gas outwardly via the gas-blowing holes, for cooling the metallic adhesive liquid on the wait-to-transfer micro light-emitting diodes.

Each of the transfer heads is disposed with a resistance heating body, said heating module conducts the electricity to the resistance heating body, for heating the cured metallic adhesive liquid.

The gas that said gas-blowing holes blow is helium.

The present invention provides a method for transferring micro light-emitting diodes, which comprises the following steps of:

step S1, providing a transport substrate which is disposed thereon with the micro light-emitting diodes;

step S2, providing an apparatus for transferring the micro light-emitting diodes, which comprises: a main body, and a spraying module, a cooling module and a heating module disposed on said main body;

step S3, said spraying module spraying metallic adhesive liquid onto the micro light-emitting diodes, said cooling module cooling the metallic adhesive liquid where said spraying module sprays, thereby curing the metallic adhesive liquid, to adhesively bond the main body with the micro light-emitting diodes together; and step S4, providing a receiving substrate, said apparatus for transferring the micro light-emitting diodes moving said micro light-emitting diodes to preset bonding positions on the receiving substrate, said heating module heating said cured metallic adhesive liquid, thereby melting the metallic adhesive liquid, to separate the main body from the micro light-emitting diodes, whereby said micro light-emitting diodes are transferred onto the receiving substrate.

Said main body comprises: a number of sequentially arranged transfer heads each disposed with a spraying nozzle on a bottom portion thereof; in said step S3, the spraying module sprays metallic adhesive liquid onto the micro light-emitting diodes via the spraying nozzle.

Each neighboring pair of the transfer heads are disposed with a gas-blowing hole on therebetween; in said step S3, the cooling module blows gas outwardly via the gas-blowing holes, for cooling the metallic adhesive liquid that the spraying module sprays.

Each of the transfer heads is disposed with a resistance heating body; in said step S4, the heating module conducts the electricity to the resistance heating body, for heating the cured metallic adhesive liquid.

In said step S3, the gas that said gas-blowing holes blow is helium.

The present invention further provides an apparatus for transferring micro light-emitting diodes, which comprises: a main body, and a spraying module, a cooling module and a heating module disposed on said main body;

said spraying module is applied for spraying metallic adhesive liquid onto the micro light-emitting diodes that wait to transfer;

said cooling module is applied for cooling the metallic adhesive liquid on the wait-to-transfer micro light-emitting diodes, thereby curing the metallic adhesive liquid, to adhesively bond the main body with the wait-to-transfer micro light-emitting diodes together;

said heating module is applied for heating the cured metallic adhesive liquid, thereby melting the metallic adhesive liquid, to separate the main body from the wait-to-transfer micro light-emitting diodes;

wherein said main body comprises: a number of sequentially arranged transfer heads each disposed with a spraying nozzle on a bottom portion thereof, said spraying module sprays the metallic adhesive liquid onto the wait-to-transfer micro light-emitting diodes via the spraying nozzle;

wherein each neighboring pair of the transfer heads are disposed with a gas-blowing hole on therebetween, said cooling module blows gas outwardly via the gas-blowing holes, for cooling the metallic adhesive liquid on the wait-to-transfer micro light-emitting diodes;

wherein each of the transfer heads is disposed with a resistance heating body, said heating module conducts electricity to the resistance heating body, for heating the cured metallic adhesive liquid.

A beneficial effect of the present invention is that the present invention provides an apparatus for transferring micro light-emitting diodes, which comprises a main body, and a spraying module, a cooling module and a heating module disposed on said main body, and can spray metallic adhesive liquid onto the micro light-emitting diodes that wait to transfer, by the spraying module, and can cool the metallic adhesive liquid on the wait-to-transfer micro light-emitting diodes by the cooling module, thereby curing the metallic adhesive liquid, to adhesively bond the main body with the wait-to-transfer micro light-emitting diodes together, for implementing the transfer of the micro light-emitting diodes. After transferred to reach the position, the cured metallic adhesive liquid is heated by the heating module whereby the metallic adhesive liquid is melted to separate the main body from the wait-to-transfer micro light-emitting diodes. This is capable of lowering the difficulty of transferring the micro light-emitting diodes, and enhancing the efficiently of transferring the micro light-emitting diodes. The present invention further provides a method for transferring micro light-emitting diodes, which is capable of lowering the difficulty of transferring the micro light-emitting diodes, and enhancing the efficiently of transferring the micro light-emitting diodes.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
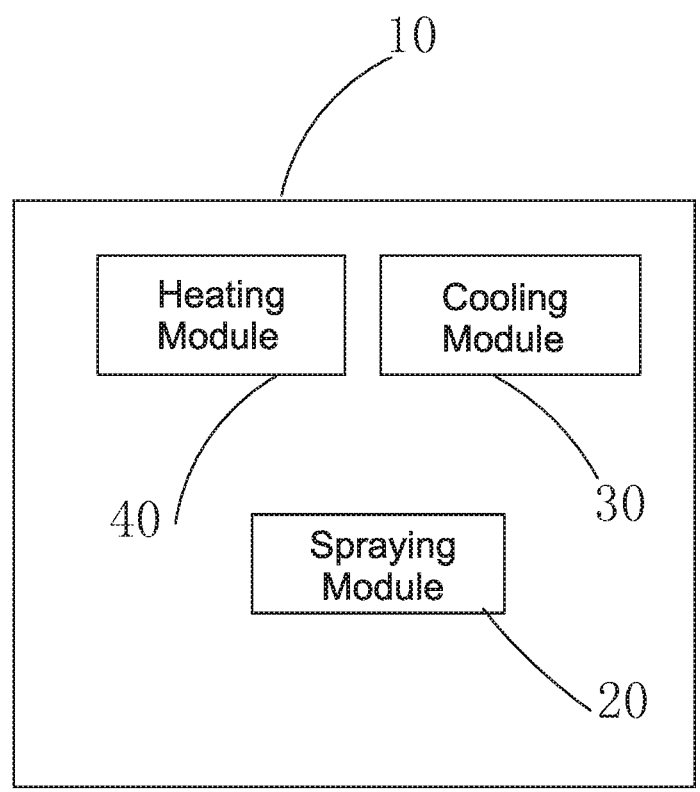
FIG. 1 is a modular schematic diagram of an apparatus for transferring micro light-emitting diode of the present invention.

Referring to FIG. 1, the present invention provides an apparatus for transferring micro light-emitting diodes, which comprises: a main body 10, and a spraying module 20, a cooling module 30 and a heating module 40 disposed on said main body 10.

Among them, said spraying module 20 is applied for spraying metallic adhesive liquid onto the micro light-emitting diodes that wait to transfer; said cooling module 30 is applied for cooling the metallic adhesive liquid on the wait-to-transfer micro light-emitting diodes, thereby curing the metallic adhesive liquid, so as to adhesively bond the main body 10 with the wait-to-transfer micro light-emitting diodes together; said heating module 40 is applied for heating the cured metallic adhesive liquid, thereby melting the metallic adhesive liquid, so as to separate the main body 10 from the wait-to-transfer micro light-emitting diodes.

Figure 2:
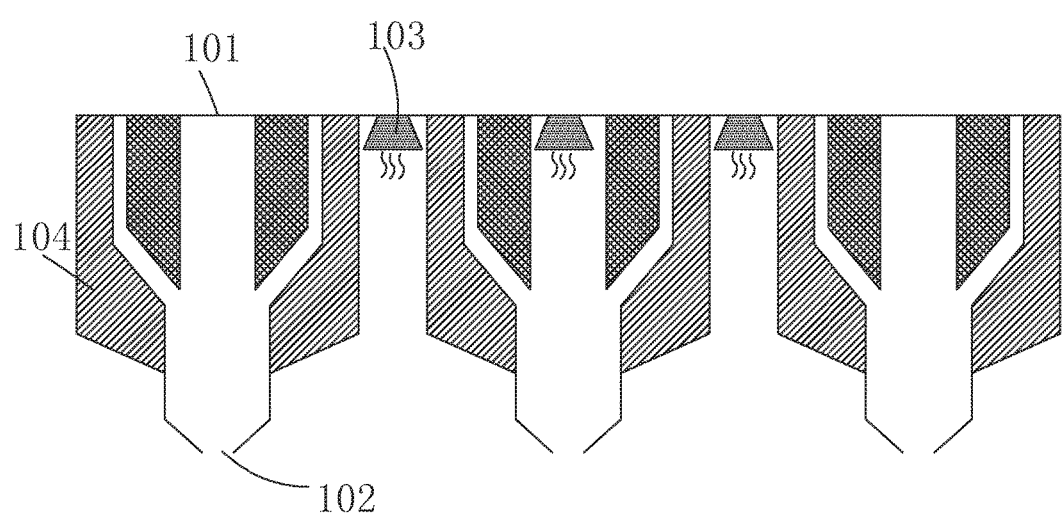
FIG. 2 is a structurally schematic diagram of the apparatus for transferring micro light-emitting diode of the present invention.

Concretely, as shown in FIG. 2, said main body 10 comprises a number of sequentially arranged transfer heads 101 each disposed with a spraying nozzle on a bottom portion thereof 102, said spraying module 20 sprays the metallic adhesive liquid onto the wait-to-transfer micro light-emitting diodes via the spraying nozzle 102. Furthermore, as shown in FIG. 2, each neighboring pair of the transfer heads 101 is disposed with a gas-blowing hole 103 on therebetween, said cooling module 30 blows gas outwardly via the gas-blowing holes 103 for cooling the metallic adhesive liquid on the wait-to-transfer micro light-emitting diodes. As shown in FIG. 2, each of the transfer heads 101 is disposed with a resistance heating body 104, said heating module 40 conducts the electricity to the resistance heating body 104 to heat the cured metallic adhesive liquid.

Preferably, the gas that said gas-blowing holes 103 blows is helium, said resistance heating body 104 is of tungsten, said metallic adhesive liquid is selected from indium (In), gallium (Ga), lead (Pb), tin (Sn), etc., low melting point metal and alloy thereof.

As long as transferring the micro light-emitting diodes, the aforementioned apparatus for transferring the micro light-emitting diodes firstly adhesively bonds the main body 10 with the wait-to-transfer micro light-emitting diodes together by the cured metallic adhesive liquid, and after accomplishing the transfer of the micro light-emitting diodes, melts the metallic adhesive liquid so as to separate the micro light-emitting diodes from the main body 10. Compared with the prior transferring apparatus that exerts electrostatic force to absorb micro light-emitting diodes, it is capable of lowering the difficulty of transferring the micro light-emitting diodes, and enhancing the efficiently of transferring the micro light-emitting diodes.

Figure 12:
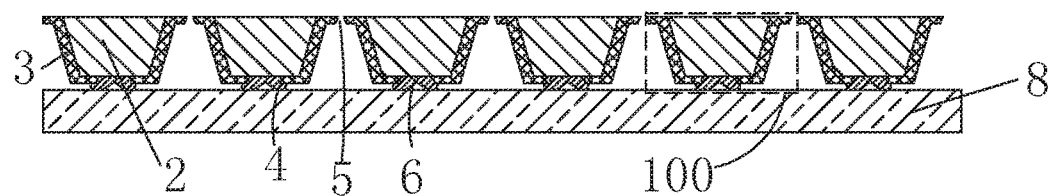
FIG. 12 is a schematic diagram of a step S1 of the method of transferring the micro light-emitting diodes.
Figure 16:
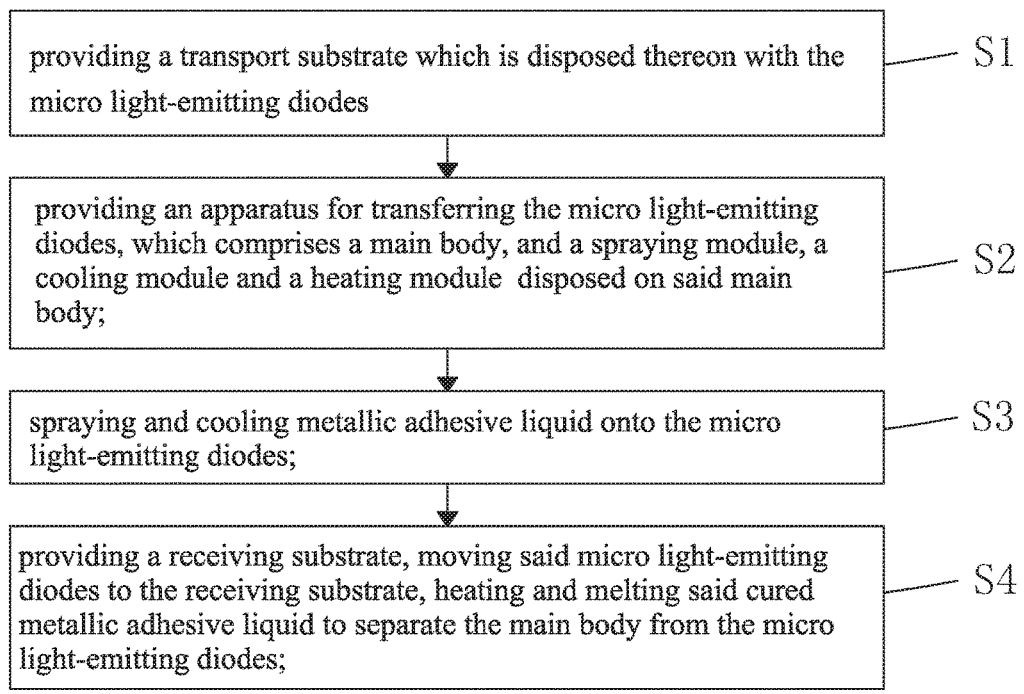
FIG. 16 is a flow chart of the method of transferring the micro light-emitting diodes.

Referring to FIG. 16, the present invention further provides a method for transferring micro light-emitting diodes, which comprises the following steps of:

step S1, referring to FIG. 12, providing a transport substrate 8 which is disposed thereon with the micro light-emitting diodes 100.

Figure 3:
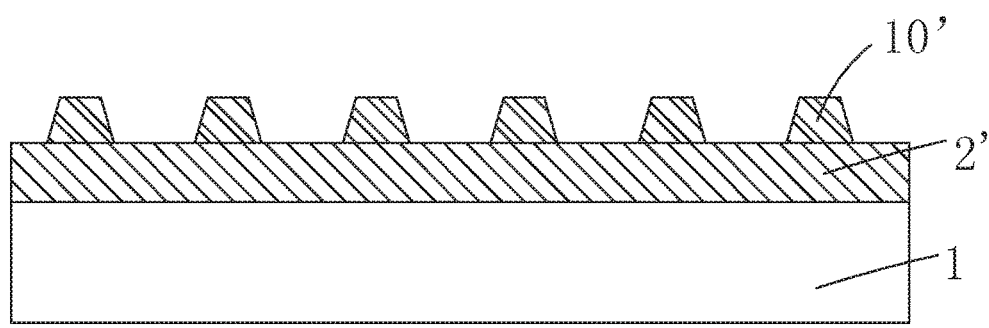
FIGS. 3-11 are schematic diagrams of micro light-emitting diode manufacturing process of a method of transferring the micro light-emitting diodes of the present invention.
Figure 4:
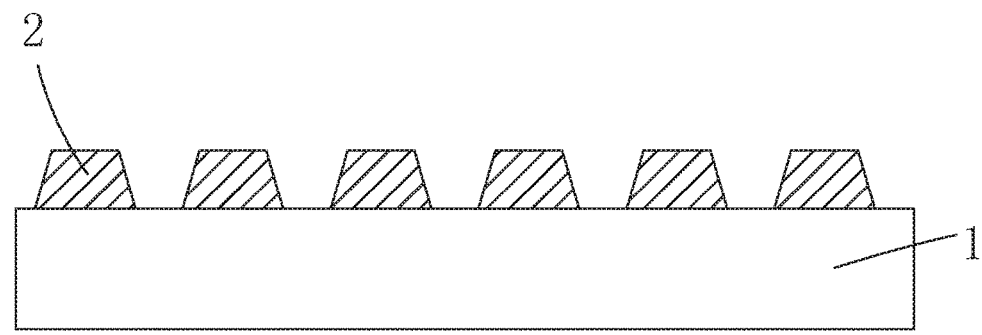
Figure 5:
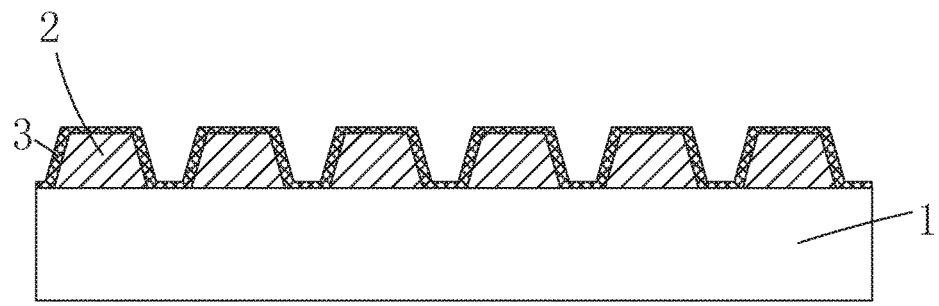
Figure 6:
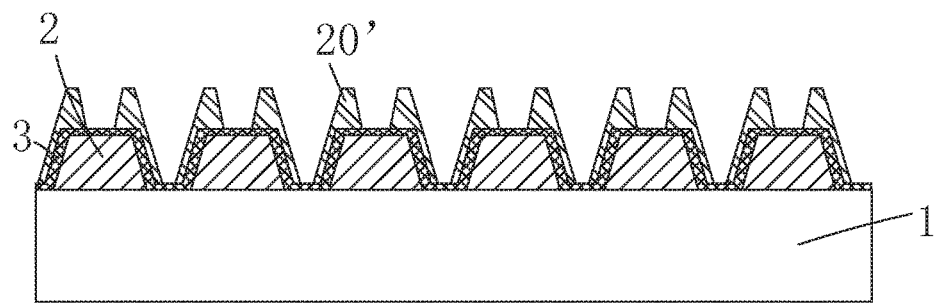
Figure 7:
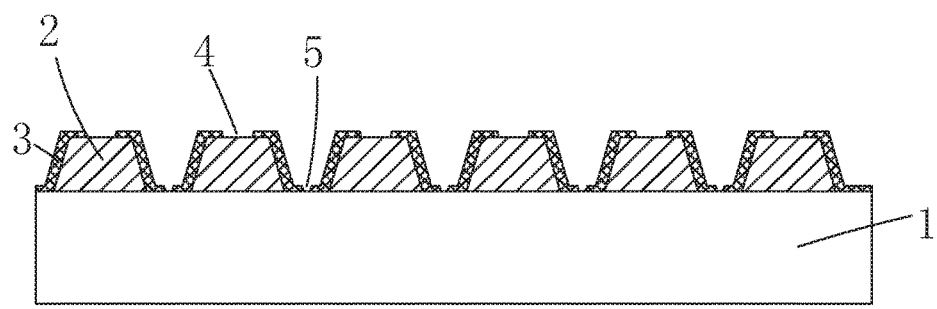
Figure 8:
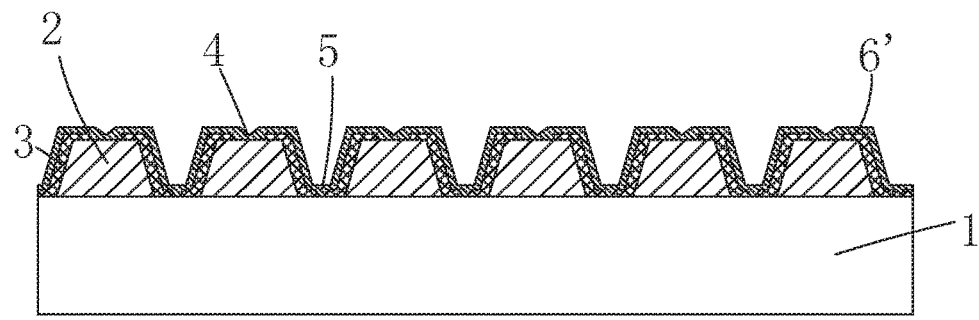
Figure 9:
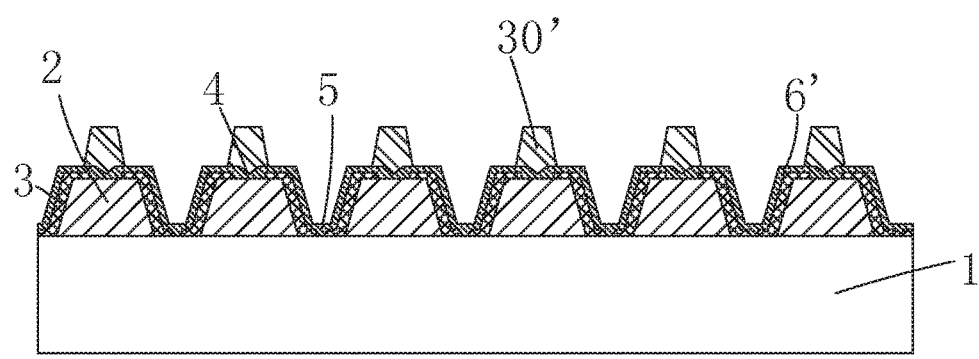
Figure 10:
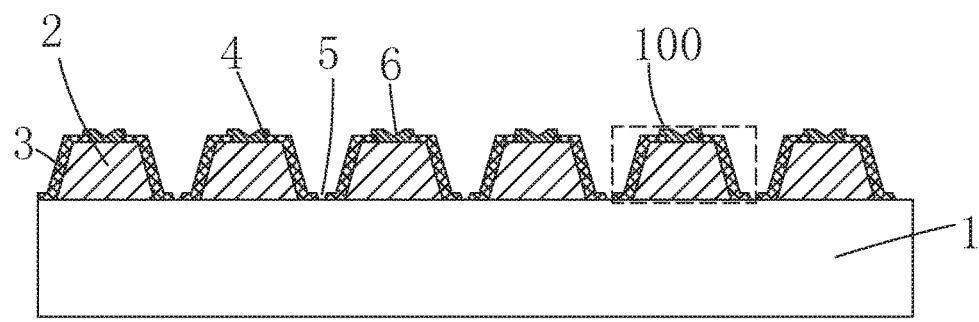
Figure 11:
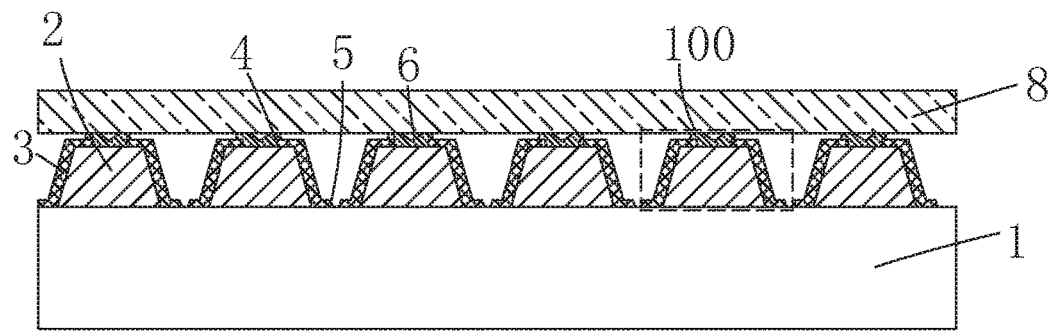

Concretely, before said step S1, it further comprises a process for manufacturing and transporting said micro light-emitting diodes 100 onto the transport substrate 8, which concretely comprises: referring to FIG. 3, firstly providing an original substrate 1, forming a LED semiconductor thin film 2' on said original substrate 1, and forming a first photoresist layer 10' that is patterned on said LED semiconductor thin film 2'; next, referring to FIG. 4, treating said first photoresist layer 10' as shielding, implementing etching of said LED semiconductor thin film 2' to form a LED semiconductor layer 2; then, referring to FIG. 5 and FIG. 6, a first insulating layer 3 covering said LED semiconductor layer 2 and the original substrate 1, forming a second photoresist layer 20' that is patterned on said first insulating layer 3; then, referring to FIG. 7, treating the second photoresist layer 20' as shielding, implementing etching of said first insulating layer 3, forming first via holes 4 and second via holes 5 extended through said second insulating layer 3 and respectively exposing a portion of said LED semiconductor layer 2 and a portion of the original substrate 1; next, referring to FIG. 8 and FIG. 9, forming a first metallic thin film 6' on said first insulating layer 3, the LED semiconductor layer 2, and the original substrate 1, forming a third photoresist layer 30' that is patterned on said first metallic thin film 6'; next, referring to FIG. 10, treating the third photoresist layer 30' as shielding, implementing etching of said first metallic thin film 6', forming bottom electrodes 6 that contact with the LED semiconductor layer 2 by the first via holes 4, to achieve the micro light-emitting diodes 100 after manufacturing; finally, referring to FIG. 11, providing a transport substrate 8, adhesively bonding a surface of said transport substrate 8 with the bottom electrodes 6, stripping said original substrate 1, to make the micro light-emitting diodes 100 transferred onto the transport substrate 8, and exposing a lateral surface of said LED semiconductor layer 2 where the original substrate 1 contacts.

Furthermore, said micro light-emitting diodes 100 is a semi-finished product that is not implemented by encapsulation, said original substrate 1 may be a sapphire substrate ($Al_2O_3$), silicon substrate (Si), silicon carbide substrate (SiC), or gallium nitride substrate (GaN), etc., said LED semiconductor layer 2 comprises: $N^+$ layer, $P^+$ layer, and multi-quantum-well layer that contacts with the $N^+$ layer and $P^+$ layer. The bottom electrodes 6 are of one metal of nickel, molybdenum, aluminum, aurum, platinum, titanium etc. or a combination of a variety thereof. Said first insulating layer 3 is of silicon oxide, silicon nitride, or alumina etc.

Concretely, said transport substrate 8 is a hard substrate where a surface thereof is disposed with an adhesively bonding layer. By the adhesively bonding layer of the surface of said hard substrate to adhesively bond the bottom electrodes 6, it is facilitated that the bottom electrodes 6 and transport substrate 8 are connected with each other. Furthermore, by way of the laser lift-off technology to remove the original substrate 1, it is facilitated that the micro light-emitting diodes 100 are transferred onto the transport substrate 8 and are inverted upside down; that is also, the lateral surface of said LED semiconductor layer 2 that contacts with said original substrate 1 is far away from said transport substrate 8, to expose the lateral surface of the LED semiconductor layer 2 that contacts with the original substrate 1.

Step S2, referring to FIG. 1, providing an apparatus for transferring the micro light-emitting diodes, which comprises a main body 10, and a spraying module 20, a cooling module 30 and a heating module 40 disposed on said main body 10.

Concretely, as shown in FIG. 2, said main body 10 comprises a number of sequentially arranged transfer heads 101 each disposed with a spraying nozzle on a bottom portion thereof 102, each neighboring two of the transfer heads 101 in pair is disposed with a gas-blowing hole 103 on therebetween, and each of the transfer heads 101 is disposed with a resistance heating body 104.

Figure 13:
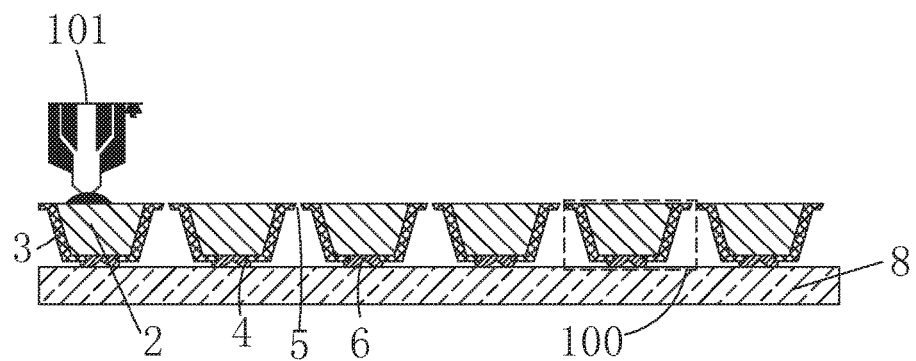
FIG. 13 is a schematic diagram of a step S3 of the method of transferring the micro light-emitting diodes.

Step S3, as shown in FIG. 13, said spraying module 20 sprays metallic adhesive liquid onto the micro light-emitting diodes 100, said cooling module 30 cools the metallic adhesive liquid that said spraying module 20 sprays, thereby curing the metallic adhesive liquid, to adhesively bond the main body 10 with the micro light-emitting diodes 100 together.

Concretely, said step S3 concretely comprises: firstly moving said apparatus for transferring the micro light-emitting diodes to a position in an upward distance of 0 to 2 microns from a top side of said micro light-emitting diodes 100; then, said spraying module 20 spraying metallic adhesive liquid onto the LED semiconductor layer 2 of said micro light-emitting diodes 100 via the spraying nozzle 102; and next, said gas-blowing holes 103 blowing gas outwardly, thereby curing the metallic adhesive liquid to adhesively bond the main body 10 with the micro light-emitting diodes 100 together. Preferably, the gas that said gas-blowing holes 103 outwardly blow is helium (He).

Preferably, said metallic adhesive liquid is selected from indium (In), gallium (Ga), lead (Pb), tin (Sn), etc., low melting point metal and alloy thereof.

Figure 14:
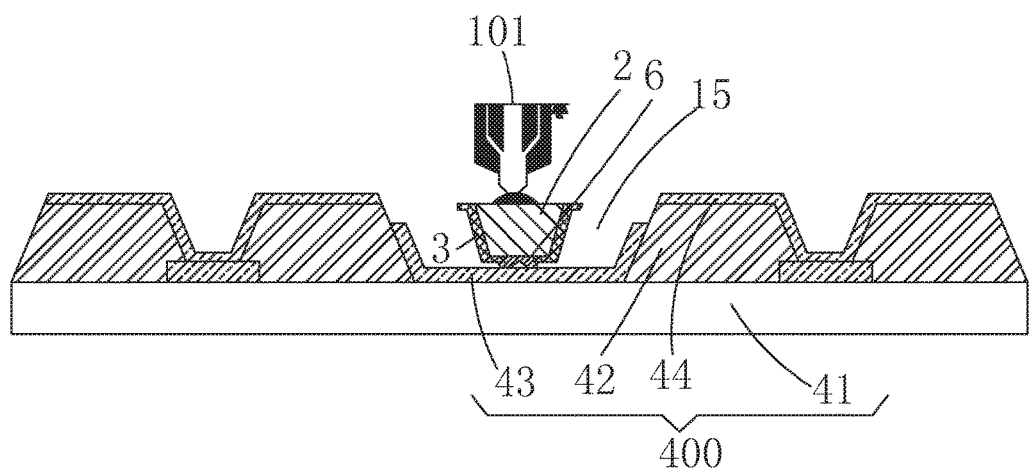
FIG. 14 is a schematic diagram of a step S4 of the method of transferring the micro light-emitting diodes.

Step S4, as shown in FIG. 14, is of providing a receiving substrate 400, said apparatus for transferring the micro light-emitting diodes moving said micro light-emitting diodes 100 to preset bonding positions on the receiving substrate 400, said heating module 40 heating said cured metallic adhesive liquid, thereby melting the metallic adhesive liquid, to separate the main body 10 from the micro light-emitting diodes 100, whereby said micro light-emitting diodes 100 are transferred onto the receiving substrate 400.

Concretely, as shown in FIG. 14, said receiving substrate 400 comprises: a base substrate 41, a pixel definition layer 42 disposed on said base substrate 41, a pixel groove 15 formed within said pixel definition layer 42, a bottom electrode contact 43 disposed on a bottom portion of said pixel groove 15, a top electrode contact 44 disposed on the pixel definition layer 42 beside said pixel groove 15. Certainly, said receiving substrate 400 can further comprise thin film transistors, etc., driving devices, these all can employ the prior technology, which will not be described hereinafter, redundantly.

Concretely, said step S4 concretely comprises: firstly moving said micro light-emitting diodes 100 onto the bottom electrode contact 43 within the pixel groove 15; then said heating module 40 conducting the electricity to said resistance heating body 104, to make a temperature of the resistance heating body 104 rising; thereby heating said cured metallic adhesive liquid to melt the metallic adhesive liquid, so as to separate the main body 10 from the micro light-emitting diodes 100, and bond said bottom electrode 6 with the bottom electrode contact 43 together. Preferably, said resistance heating body 104 is of tungsten.

Concretely, a process of bonding said bottom electrode 6 with the bottom electrode contact 43 is, while the bottom electrode 6 contacts with the bottom electrode contact 43, firstly heating and melting said bottom electrode contact 43, and then cooling and curing said bottom electrode contact 43, thereby bonding said bottom electrode 6 with the bottom electrode contact 43 together. Preferably, said bottom electrode contact 43 is of lead or tin, etc., low melting point metal.

Figure 15:
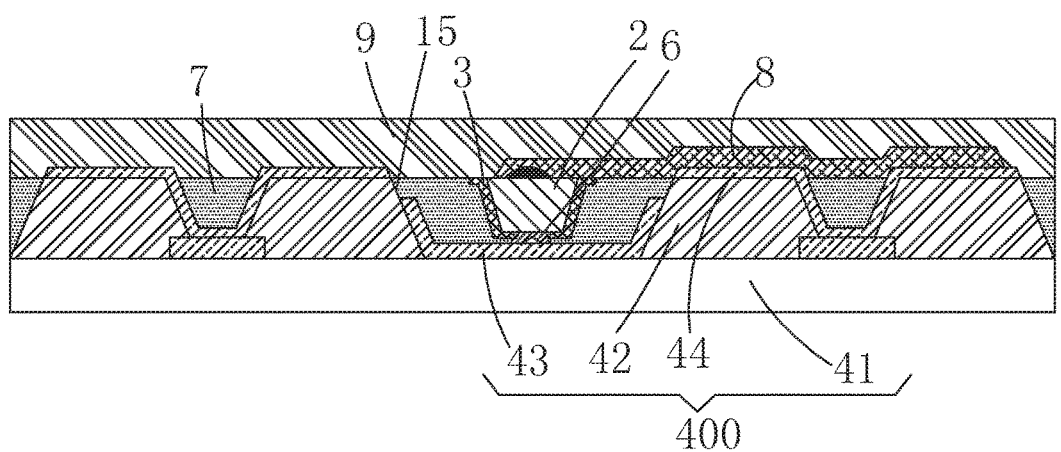
FIG. 15 is a schematic diagram of micro light-emitting diode encapsulation process of the method of transferring the micro light-emitting diodes.

Furthermore, said micro light-emitting diodes 100 being transferred onto the receiving substrate 400 further needs implementing encapsulation for said micro light-emitting diodes 100, said encapsulation process concretely comprises: referring to FIG. 15, firstly filling an encapsulation glue material 7 within between said pixel definition layers 42, to make a surface of the encapsulation glue material 7 flushed with said pixel definition layer 42; next, depositing a conductive film on said micro light-emitting diodes 100, the pixel definition layer 42, the encapsulation glue material 7 and the top electrode contact 44, and then patterning said conductive film to achieve the top electrode 8 that contacts with said LED semiconductor layer 2 and the top the electrode contact 44; and finally, forming a protection layer 9 on said top electrode 8, the pixel definition layer 42 and the encapsulation glue material 7.

Concretely, said top electrode 8 is a transparent electrode which is of indium tin oxide (ITO), indium zinc oxide (IZO), silver nanowires, or a mixture of polyethylene dioxythiophene and polystyrene sulfonic acid (PEDOT:PS), etc. Said protection layer 9 has not only a protection function but also further has functions in auxiliary heat dissipation and light extraction.

The aforementioned method for transferring micro light-emitting diodes, employing an apparatus for transferring the micro light-emitting diodes, which comprises a main body 10, and a spraying module 20, a cooling module 30 and a heating module 40, to implement the transfer of the micro light-emitting diodes 100, that is firstly adhesively bonding the main body 10 with the micro light-emitting diodes 100 together by curing the metallic adhesive liquid while transferring the micro light-emitting diodes 100; after transferring the micro light-emitting diodes 100 to the receiving substrate 400, melting the metallic adhesive liquid to separate the micro light-emitting diodes 100 from the main body 10. Compared with the prior method which exerts electrostatic force to absorb the micro light-emitting diodes for implementing transferring thereof, it is capable of lowering the difficulty of transferring the micro light-emitting diodes 100, and enhancing efficiency of transferring the micro light-emitting diodes 100.

In conclusion, the present invention provides an apparatus for transferring micro light-emitting diodes, which comprises a main body, and a spraying module, a cooling module and a heating module disposed on said main body, and by means of a spraying module spraying metallic adhesive liquid onto the wait-to-transfer micro light-emitting diodes, by means of a cooling module cooling the metallic adhesive liquid on the wait-to-transfer micro light-emitting diodes, thereby curing the metallic adhesive liquid to adhesively bond the main body with the wait-to-transfer micro light-emitting diodes together, for implementing the transfer of the micro light-emitting diodes, and after transferred to reach the position, by means of the heating module heating the cured metallic adhesive liquid, thereby melting the metallic adhesive liquid, to separate the main body from the wait-to-transfer micro light-emitting diodes. It is capable of lowering the difficulty of transferring the micro light-emitting diodes, and enhancing the efficiently of transferring the micro light-emitting diodes. The present invention further provides a method for transferring micro light-emitting diodes, which is capable of lowering the difficulty of transferring the micro light-emitting diodes, and enhancing the efficiently of transferring the micro light-emitting diodes.

As above mentioned, in accordance with technical embodiments and technical solution of the present invention, to any persons who are ordinary skilled in the art, other related change or variances can be made which should be covered by the protected scope of the subject claims attached below by the present invention.

What is claimed is:

1. An apparatus for transferring micro light-emitting diodes, which comprises: a main body, and a spraying module, a cooling module and a heating module disposed on said main body;
   said spraying module applied for spraying metallic adhesive liquid onto the micro light-emitting diodes that wait to transfer;
   said cooling module applied for cooling the metallic adhesive liquid on the wait-to-transfer micro light-emitting diodes, thereby curing the metallic adhesive liquid to adhesively bond the main body with the wait-to-transfer micro light-emitting diodes together; and
   said heating module applied for heating the cured metallic adhesive liquid, thereby melting the metallic adhesive liquid to separate the main body from the wait-to-transfer micro light-emitting diodes;
   wherein said main body comprises a number of sequentially arranged transfer heads each disposed with a spraying nozzle on a bottom portion thereof, said spraying module sprays the metallic adhesive liquid onto the wait-to-transfer micro light-emitting diodes by the spraying nozzle;
   wherein each neighboring pair of the transfer heads are disposed with a gas-blowing hole on therebetween, said cooling module blows gas outwardly via the gas-blowing hole, for cooling the metallic adhesive liquid on the wait-to-transfer micro light-emitting diodes.

2. The apparatus for transferring the micro light-emitting diodes as claimed in claim 1, wherein each of the transfer heads is disposed with a resistance heating body, said heating module conducts electricity to the resistance heating body, for heating the cured metallic adhesive liquid.

3. The apparatus for transferring the micro light-emitting diodes as claimed in claim 1, wherein the gas that said gas-blowing hole blows is helium.

4. A method for transferring micro light-emitting diodes, which comprises the following steps of:
   step S1, providing a transport substrate that is disposed thereon with the micro light-emitting diodes;
   step S2, providing an apparatus for transferring the micro light-emitting diodes, which comprises a main body, and a spraying module, a cooling module and a heating module disposed on said main body;
   step S3, said spraying module spraying metallic adhesive liquid onto the micro light-emitting diodes, said cooling module cooling the metallic adhesive liquid where said spraying module sprays and thereby curing the metallic adhesive liquid to adhesively bond the main body with the micro light-emitting diodes together; and step S4, providing a receiving substrate, said apparatus for transferring micro light-emitting diodes moving said micro light-emitting diodes to preset bonding positions on the receiving substrate, said heating module heating said cured metallic adhesive liquid and thereby melting the metallic adhesive liquid to separate the main body from the micro light-emitting diodes, so that said micro light-emitting diode is transferred onto the receiving substrate.

5. The method of transferring the micro light-emitting diodes as claimed in claim 4, wherein said main body comprises a number of sequentially arranged transfer heads each disposed with a spraying nozzle on a bottom portion thereof, the spraying module sprays the metallic adhesive liquid onto the micro light-emitting diodes via the spraying nozzle in said step S3.

6. The method of transferring the micro light-emitting diodes as claimed in claim 5, wherein each neighboring pair of the transfer heads are disposed with a gas-blowing hole on therebetween, the cooling module blows gas outwardly via the gas-blowing hole, for cooling the metallic adhesive liquid that the spraying module sprays, in said step S3.

7. The method of transferring the micro light-emitting diodes as claimed in claim 5, wherein each of the transfer heads is disposed with a resistance heating body, the heating module conducts electricity to the resistance heating body, for heating the cured metallic adhesive liquid, in said step S4.

8. The method of transferring the micro light-emitting diodes as claimed in claim 6, wherein the gas that said gas-blowing hole blows is helium, in said step S3.

9. An apparatus for transferring micro light-emitting diodes, which comprises: a main body, and a spraying module, a cooling module and a heating module disposed on said main body;

said spraying module applied for spraying metallic adhesive liquid onto the micro light-emitting diodes that wait to transfer;

said cooling module applied for cooling the metallic adhesive liquid on the wait-to-transfer micro light-emitting diodes and thereby curing the metallic adhesive liquid to adhesively bond the main body with the wait-to-transfer micro light-emitting diodes together; and said heating module applied for heating the cured metallic adhesive liquid and thereby melting the metallic adhesive liquid to separate the main body from the wait-to-transfer micro light-emitting diodes;

wherein said main body comprises a number of sequentially arranged transfer heads each disposed with a spraying nozzle on a bottom portion thereof, said spraying module sprays the metallic adhesive liquid onto the wait-to-transfer micro light-emitting diodes via the spraying nozzle;

wherein each neighboring pair of the transfer heads are disposed with a gas-blowing hole on therebetween, said cooling module blows gas outwardly via the gas-blowing hole, for cooling the metallic adhesive liquid on the wait-to-transfer micro light-emitting diodes;

wherein each of the transfer heads is disposed with a resistance heating body, said heating module conducts electricity to the resistance heating body, for heating the cured metallic adhesive liquid.

10. The apparatus for transferring the micro light-emitting diodes as claimed in claim 9, wherein the gas that said gas-blowing hole blows is helium.

* * * * *